United States Patent
Das et al.

(10) Patent No.: US 10,541,680 B2
(45) Date of Patent: Jan. 21, 2020

(54) LOW AREA ENABLE FLIP-FLOP

(71) Applicant: Texas Instruments Incorporated, Dallas, TX (US)

(72) Inventors: Subhankar Das, Karnataka (IN); Soman Purushothaman, Wayanad (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/585,263

(22) Filed: Dec. 30, 2014

(65) Prior Publication Data

US 2016/0191028 A1 Jun. 30, 2016

(51) Int. Cl.
*H03K 3/289* (2006.01)
*H03K 3/3562* (2006.01)
*H03K 3/037* (2006.01)

(52) U.S. Cl.
CPC ....... *H03K 3/35625* (2013.01); *H03K 3/0372* (2013.01)

(58) Field of Classification Search
None
See application file for complete search history.

(56) References Cited

U.S. PATENT DOCUMENTS

| 5,721,740 A * | 2/1998 | Moon | G01R 31/3183 |
| | | | 702/108 |
| 7,616,040 B2 * | 11/2009 | Motomura | H03K 3/356156 |
| | | | 327/202 |
| 8,427,214 B2 * | 4/2013 | Pal | H03K 3/35625 |
| | | | 327/202 |
| 2009/0058484 A1 * | 3/2009 | Rao | H03K 3/012 |
| | | | 327/202 |
| 2013/0042158 A1 * | 2/2013 | Hsieh | G01R 31/31854 |
| | | | 714/726 |
| 2014/0218090 A1 * | 8/2014 | Bartling | H03K 3/289 |
| | | | 327/203 |

OTHER PUBLICATIONS

Weste et al., Principles of CMOS VLSI Design: A Systems Perspective, 1993, Addison Wesley, 2nd Edition, p. 91.*

* cited by examiner

*Primary Examiner* — Long Nguyen

(74) *Attorney, Agent, or Firm* — Lawrence J. Bassuk; Charles A. Brill; Frank D. Cimino

(57) ABSTRACT

The disclosure provides a flip-flop. The flip-flop includes a master latch. The master latch receives a flip-flop input, a clock input, an inverted clock input, an enable signal and an inverted enable signal. A slave latch is coupled to the master latch and receives the enable signal and the inverted enable signal. An output inverter is coupled to the slave latch and generates a flip-flop output.

7 Claims, 6 Drawing Sheets

US 10,541,680 B2

LOW AREA ENABLE FLIP-FLOP

TECHNICAL FIELD

The present disclosure is generally related to low area enable flip-flops in an integrated circuit.

BACKGROUND

As a result of the continuous developments in integrated circuits (ICs), the flip-flops contribute to a substantial portion of any circuit design's power. The various units of an IC that consume power are logic implementation, flip-flops, RAM, clock tree and integrated clock gating (ICG) cells. The comparison of the power consumption by the various units is as follows; logic implementation 29%, flip-flops 27%, RAM 18%, clock tree 16% and the ICG consumes 10% of the total power in a typical design. In digital designs, the flip-flops form 20-40% of the digital sub-chips. Enable flip-flops constitute a majority of these flip-flops.

Enable flip-flops are widely used in integrated circuits. One of the prominent use of enable flip-flops is for testing devices in a semiconductor chip. A reduction in a number of transistors in an enable flip-flop will reduce the area and therefore power consumed inside the enable flip-flop. A reduction in area of enable flip-flops will directly improve the digital design area and the overall power consumption.

SUMMARY

According to one aspect of the disclosure, a flip-flop is provided. The flip-flop includes a master latch. The master latch receives a flip-flop input, a clock input, an inverted clock input, an enable signal and an inverted enable signal. A slave latch is coupled to the master latch and receives the enable signal and the inverted enable signal. An output inverter is coupled to the slave latch and generates a flip-flop output.

BRIEF DESCRIPTION OF THE VIEWS OF DRAWINGS

DETAILED DESCRIPTION OF THE EMBODIMENTS

Figure 1:
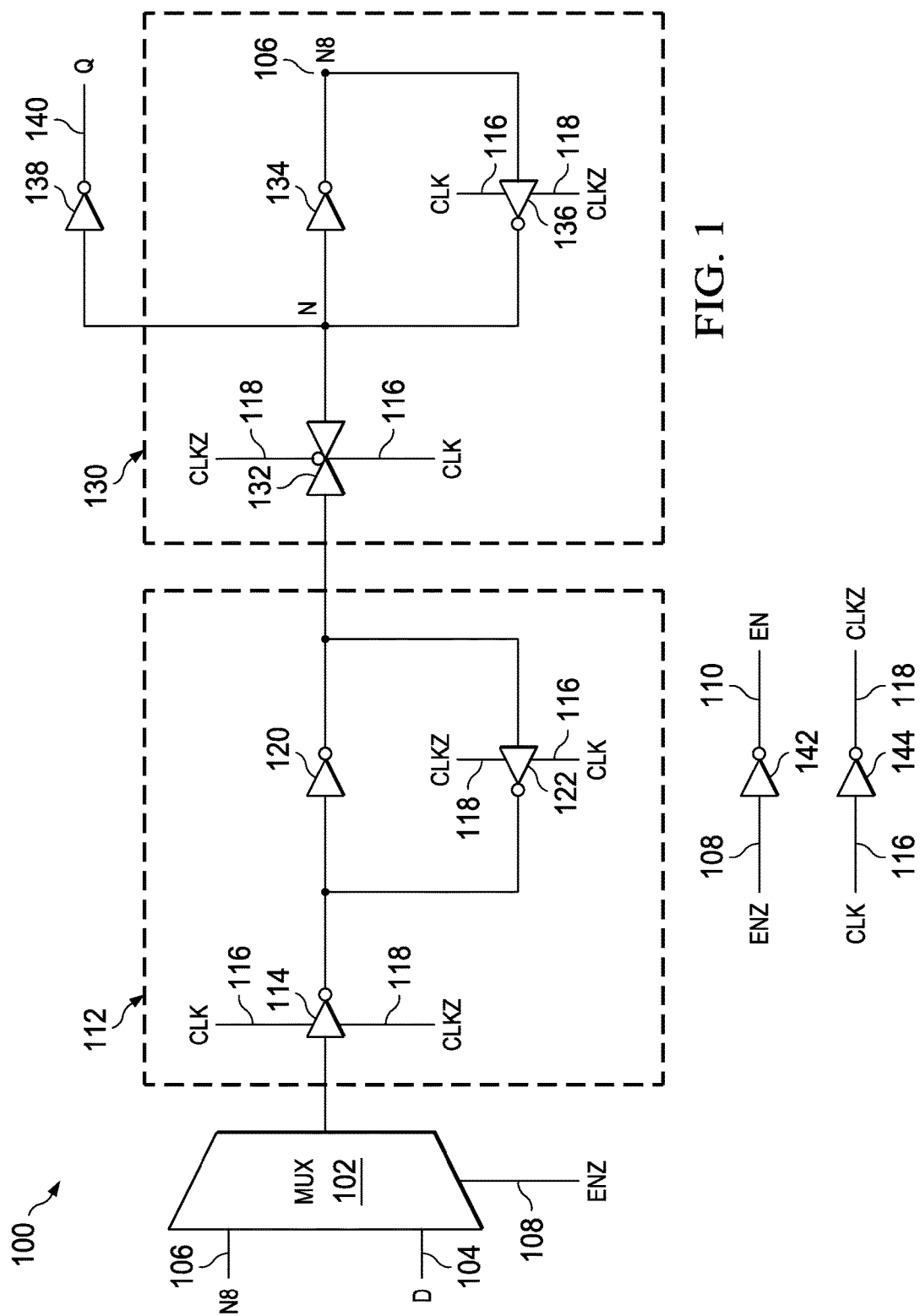
FIG. 1 illustrates a schematic of a flip-flop.

FIG. 1 illustrates a schematic of a flip-flop 100. The flip-flop 100 includes a multiplexer 102, a master latch 112, a slave latch 130, an output inverter 138, an enable inverter 142 and a clock inverter 144. The multiplexer 102 receives a flip-flop input D 104 and a first input N8 106. The multiplexer 102 also receives an inverted enable signal ENZ 108 as a selection signal.

The master latch 112 is coupled to the multiplexer 102. The master latch 112 includes a first tri-state inverter 114. The first tri-state inverter 114 receives a clock input CLK 116, an inverted clock input CLKZ 118 and an output of the multiplexer 102. The master latch 112 also includes a master inverter 120 and a second tri-state inverter 122.

The master inverter 120 receives an output of the first tri-state inverter 114. The second tri-state inverter 122 receives an output of the master inverter 120, the clock input CLK 116 and the inverted clock input CLKZ 118. The master inverter 120 also receives an output of the second tri-state inverter 122. The output of the master inverter 120 is an output of the master latch 112.

The slave latch 130 is coupled to the master latch 112. The slave latch 130 includes a slave transmission gate 132, a slave inverter 134 and a slave tri-state inverter 136. The slave transmission gate 132 receives the output of the master inverter 120, the clock input CLK 116 and the inverted clock input CLKZ 118. The slave inverter 134 is coupled to the slave transmission gate 132 at a first node N. The slave inverter 134 receives an output of the slave transmission gate 132.

An output of the slave inverter 134 is the first input N8 106. The slave tri-state inverter 136 receives the first input N8 106 from the slave inverter 134, the clock input CLK 116 and the inverted clock input CLKZ 118. An output of the slave tri-state inverter 136 is provided to the slave inverter 134 through the first node N.

An output inverter 138 is coupled to the slave latch 130 at the first node N. The output inverter 138 generates a flip-flop output Q 140. The flip-flop 100 also includes the enable inverter 142 and the clock inverter 144. The enable inverter 142 receives the inverted enable signal ENZ 108 and generates an enable signal EN 110. The clock inverter 144 receives the clock input CLK 116 and generates the inverted clock input CLKZ 118.

The operation of the flip-flop 100 illustrated in FIG. 1 is explained now. The flip-flop 100 is implemented using PMOS and NMOS transistors. A transistor level implementation of the flip-flop 100 requires 32 transistors. The flip-flop input D 104 is stored using the master latch 112 and the slave latch 130. The output inverter 138 inverts a data received from the slave latch 130 to generate the flip-flop output Q 140.

With the reduction in the number of transistors, a considerable amount of power consumed by the flip-flop 100 can be reduced.

Figure 2:
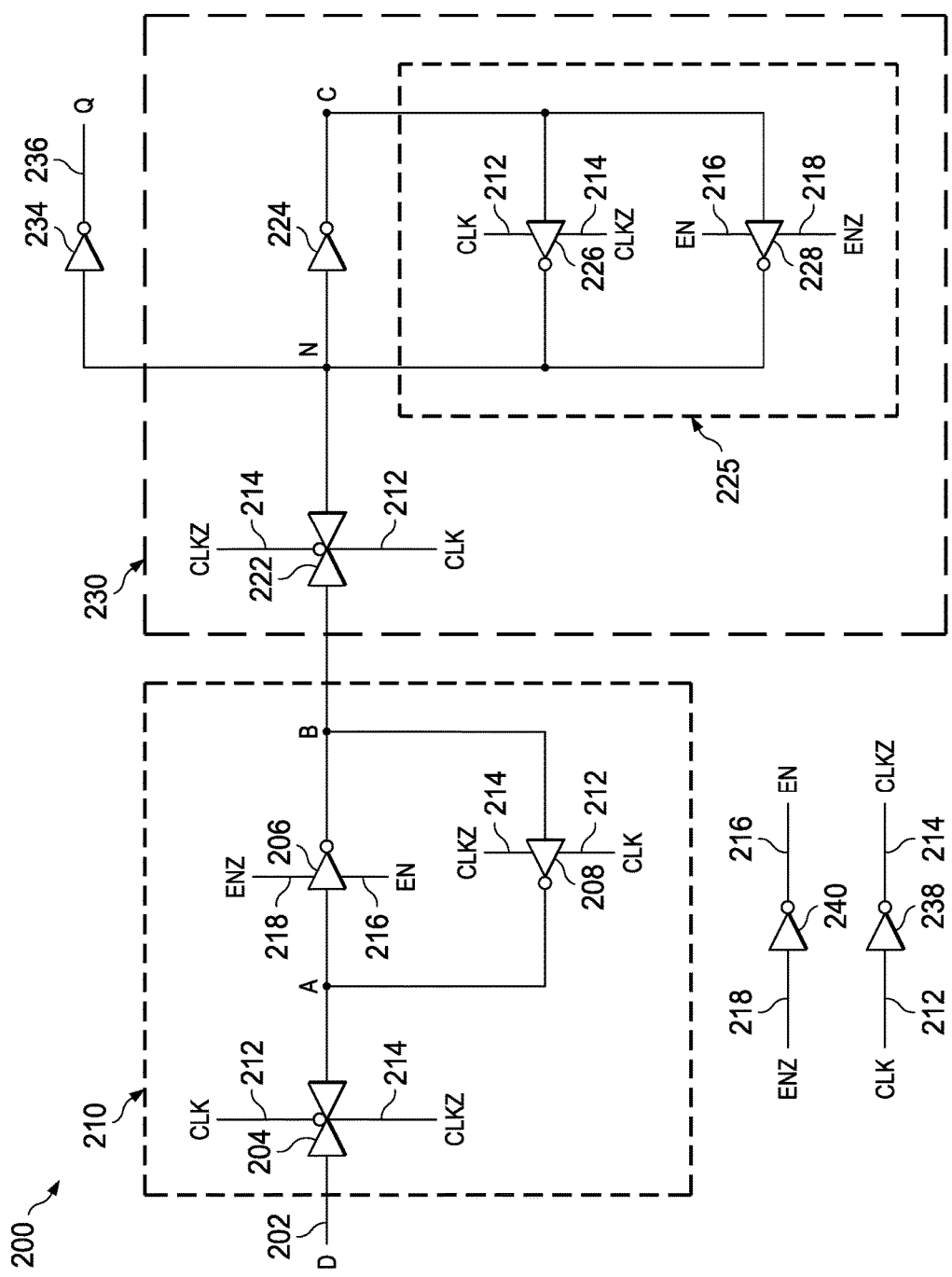
FIG. 2 illustrates a schematic of a flip-flop, according to an embodiment.

FIG. 2 illustrates a schematic of a flip-flop 200, according to an embodiment. The flip-flop 200 is one of a positive edge triggered flip-flop and a negative edge triggered flip-flop. The flip-flop 200 includes a master latch 210, a slave latch 230, an output inverter 234, a clock inverter 238 and an enable inverter 240. The master latch 210 receives a flip-flop input D 202, a clock input CLK 212, an inverted clock input CLKZ 214, an enable signal EN 216 and an inverted enable signal ENZ 218.

The master latch 210 includes a master transmission gate 204, a first tri-state inverter 206 and a second tri-state inverter 208. The master transmission gate 204 receives the flip-flop input D 202, the clock input CLK 212 and the inverted clock input CLKZ 214. The first tri-state inverter 206 is coupled to the master transmission gate 204 at a node 'A' and receives an output of the master transmission gate 204. The first tri-state inverter 206 further receives the enable signal EN 216 and the inverted enable signal ENZ 218.

The second tri-state inverter 208 receives an output of the first tri-state inverter 206, the clock input CLK 212 and the inverted clock input CLKZ 214. A node 'B' also receives the output of the first tri-state inverter 206. The first tri-state inverter 206 receives an output of the second tri-state inverter 208. The slave latch 230 is coupled to the master latch 210. The slave latch 230 receives the enable signal EN 216 and the inverted enable signal ENZ 218. The slave latch 230 also receives the clock input CLK 212 and the inverted clock input CLKZ 214.

The slave latch 230 includes a slave transmission gate 222, a slave inverter 224 and a logic unit 225. The slave transmission gate 222 receives the output of the first tri-state inverter 206, the clock input CLK 212 and the inverted clock input CLKZ 214. The slave transmission gate 222 is coupled to the node "B". The slave inverter 224 receives an output of the slave transmission gate 222. The logic unit 225 receives an output of the slave inverter 224. The output of the slave inverter 224 is received at a node 'C'. The slave inverter 224 receives an output of the logic unit 225.

The logic unit 225 includes a fifth tri-state inverter 226 and a sixth tri-state inverter 228. The fifth tri-state inverter 226 receives the output of the slave inverter 224, the clock input CLK 212 and the inverted clock input CLKZ 214. The sixth tri-state inverter 228 receives the output of the slave inverter 224, the enable signal EN 216 and the inverted enable signal ENZ 218.

A combined output of the fifth tri-state inverter 226 and the sixth tri-state inverter 228 is the output of the logic unit 225. The output of the logic unit 225 is received at a first node 'N' and provided to the slave inverter 224. The output inverter 234 is coupled to the first node 'N' and receives the output of the slave transmission gate 222. The output inverter 234 generates a flip-flop output Q 236.

The clock inverter 238 in the flip-flop 200 receives the clock input CLK 212, and generates the inverted clock input CLKZ 214 in response to the clock input CLK 212. The enable inverter 240 in the flip-flop 200 receives the inverted enable signal ENZ 218, and generates the enable signal EN 216 in response to the inverted enable signal ENZ 218.

The master latch 210 and the slave latch 230 receives at least one of a clear signal and a preset signal. The clear signal clear the bit values stored in the master latch 210 and the slave latch 230. The preset signal restores the bit values stored in the master latch 210 and the slave latch 230 to predefined values. The flip-flop 200 may include one or more additional components or inputs known to those skilled in the relevant art and are not discussed here for simplicity of the description.

The operation of the flip-flop 200 illustrated in FIG. 2 is explained now. The first tri-state inverter 206 inverts the output of the master transmission gate 204 to generate the output of the first tri-state inverter 206. The slave inverter 224 inverts the output of the slave transmission gate 222 received at the first node 'N', and the node 'C' receives the output of the slave inverter 224.

The slave inverter 224 inverts the logic at the first node 'N' to generate an output which is a logic at node 'C'. The output inverter 234 also receives the logic at the first node 'N' and generates the flip-flop output Q 236. The operation of the flip-flop 200 is now explained with the help of logic states.

The initial value of the flip-flop output Q 236 is assumed to be at logic '1'. In a first state, the clock input CLK 212 is at logic '0', the flip-flop input D 202 is at logic '0' and the inverted enable signal ENZ 218 is at logic '0'. Since, the flip-flop output Q 226 is at logic '1', the first node N is at logic 0 and node C is at logic 1. The node 'A' is at logic '0' and node 'B' is at logic '1'.

In a second state, the clock input CLK 212 transitions to logic '1'. The flip-flop input D 202 and the inverted enable signal ENZ 218 are still at logic '0'. Due to the clock input CLK 212 transitioning to logic '1', the master transmission gate 204 is inactivated and the slave transmission gate 222 is activated. Since, in the first state, node 'B' was at logic '1', the first node 'N' transition to logic '1'. Thus, a logic at node 'C' and at the flip-flop output Q 234 transition to logic '0'.

In a third state, the clock input CLK 212 transitions to logic '0', the flip-flop input D 202 transitions to logic '1' and the inverted enable signal ENZ 218 remains at logic '0'. Thus, the master transmission gate 204 is activated and the slave transmission gate 222 is inactivated. Thus, the node 'A' transitions to logic '1'. The first tri-state inverter 206 inverts the logic at node 'A' and hence, the node 'B' transition to logic '0'. Since, the slave transmission gate 222 is inactivated, the first node 'N' remains at logic '1'. The flip-flop output Q 236 and the node 'C' remains at logic '0'.

In a fourth state, the clock input CLK 212 transitions to logic '1', the flip-flop input D 202 remains at logic '1' and the inverted enable signal ENZ 218 remains at logic '0'. The master transmission gate 204 is inactivated and the slave transmission gate 222 is activated. Thus, the node 'A' and the node 'B' remains at logic '1' and '0' respectively. Since, the slave transmission gate 222 is activated, the first node 'N' transition to logic '0'. Henceforth, the flip-flop output Q 236 and the node 'C' transition to logic '1'.

When the inverted enable signal ENZ 218 transition from logic '0' to logic '1', the first tri-state inverter 206 is inactivated. Thus, the node 'B' is tri-stated. The flip-flop output Q 236 remains at logic '1'. Also, the node 'N' and the node 'C' remain at logic '1' and logic '0' respectively. The master transmission gate 204 is activated when the clock input CLK 212 transitions to logic '0'. When the master transmission gate 204 is activated, the node 'A' is at the same logic as the flip-flop input D 202. When the clock input CLK 212 transition to logic '1', the master transmission gate 204 is inactivated. In this state, the node 'A' is tri-stated.

As long as the inverted enable signal ENZ 218 remains at logic '1' the flip-flop output Q 236 remains at logic '1'. This is because the node 'N' and the node 'C' are maintained in their previous state when the inverted enable signal ENZ 218 transition from logic '0' to logic '1'. The table 1 summarizes the states of the flip-flop 200.

TABLE 1

| ENZ | D | CLK | Node 'A' | Node 'B' | Node 'N' | Node 'C' | Q |
|---|---|---|---|---|---|---|---|
| 0 | 0 | 0 | 0 | 1 | 0 | 1 | 1 |
| 0 | 0 | 1 | 0 | 1 | 1 | 0 | 0 |
| 0 | 1 | 0 | 1 | 0 | 1 | 0 | 0 |
| 0 | 1 | 1 | 1 | 0 | 0 | 1 | 1 |
| 1 | 0 | 0 | 0 | Tri-stated | 0 | 1 | 1 |
| 1 | 0 | 1 | Tri-stated | Tri-stated | 0 | 1 | 1 |
| 1 | 1 | 0 | 1 | Tri-stated | 0 | 1 | 1 |
| 1 | 1 | 1 | Tri-stated | Tri-stated | 0 | 1 | 1 |

A transistor level implementation of the flip-flop 200 requires 26 transistors. Thus, a reduction in a number of transistors in the flip-flop 200 will reduce the area and therefore power consumed inside flip-flop 200. A reduction in area of flip-flop 200 directly improves the digital design area and the overall power consumption. The flip-flop 200 provides for lower dynamic power and lower leakage as compared to flip-flop 100

Figure 3:
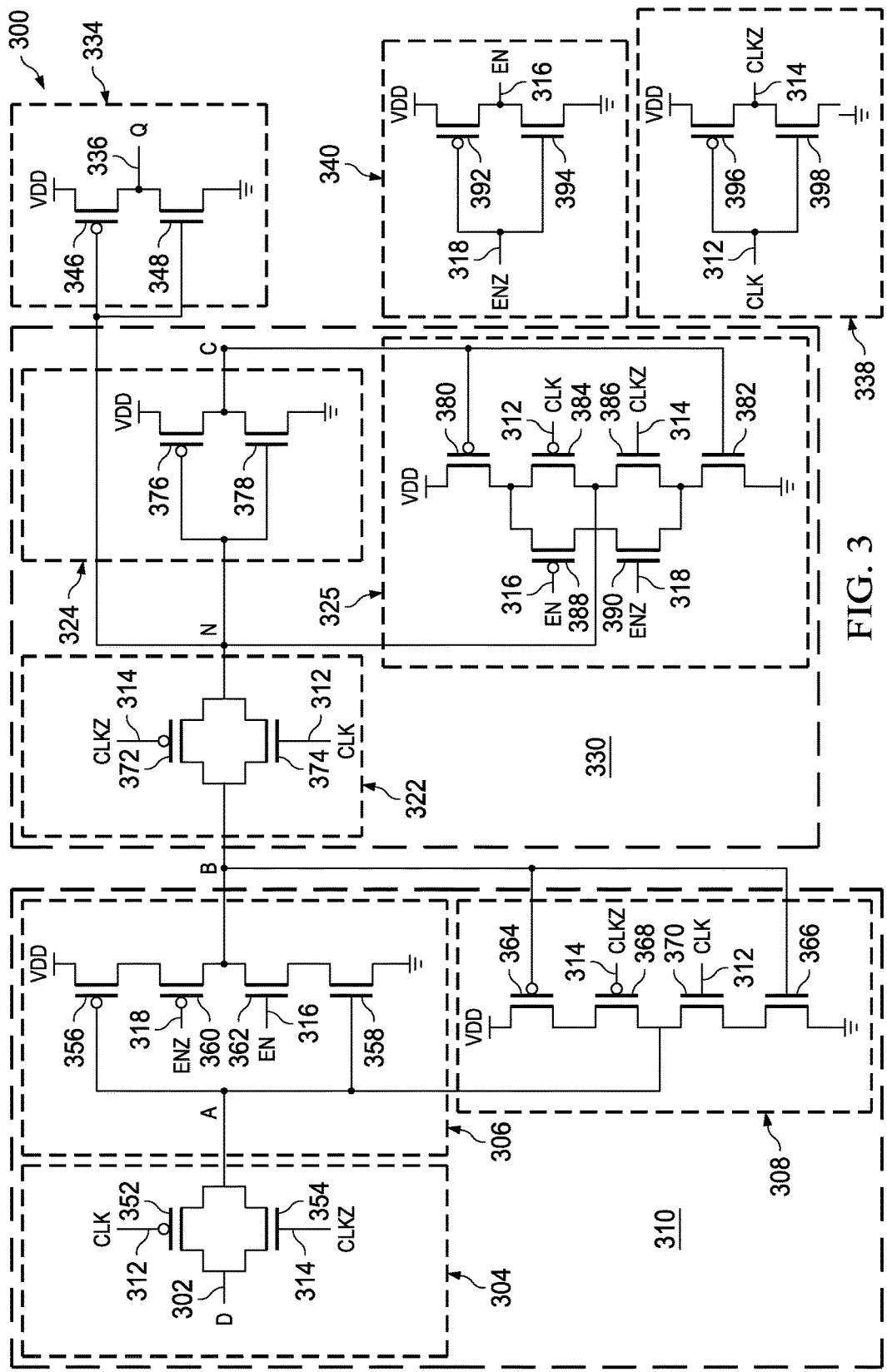
FIG. 3 illustrates a schematic of a transistor level implementation of a flip-flop, according to an embodiment.

FIG. 3 illustrates a schematic of a transistor level implementation of a flip-flop 300, according to an embodiment. The flip-flop 300 is a transistor level implementation of the flip-flop 200. The flip-flop 300 includes a master latch 310, a slave latch 330, an output inverter 334, a clock inverter 338 and an enable inverter 340. The master latch 310 receives a flip-flop input D 302, a clock input CLK 312, an inverted clock input CLKZ 314, an enable signal EN 316 and an inverted enable signal ENZ 318.

The master latch 310 includes a master transmission gate 304, a first tri-state inverter 306 and a second tri-state inverter 308. The master transmission gate 304 receives the flip-flop input D 302, the clock input CLK 312 and the inverted clock input CLKZ 314. The master transmission gate 304 includes a fourth PMOS transistor 352 and a fourth NMOS transistor 354.

A gate terminal of the fourth PMOS transistor 352 receives the clock input CLK 312. A gate terminal of the fourth NMOS transistor 354 receives the inverted clock input CLKZ 314. A source terminal of each of the fourth PMOS transistor 352 and the fourth NMOS transistor 354 receives the flip-flop input D 302. A drain terminal of each of the fourth PMOS transistor 352 and the fourth NMOS transistor 354 are coupled to the node 'A'.

The first tri-state inverter 306 is coupled to the master transmission gate 304 at a node 'A' and receives an output of the master transmission gate 304. The first tri-state inverter 306 further receives the enable signal EN 316 and the inverted enable signal ENZ 318. The first tri-state inverter 306 includes a fifth PMOS transistor 356 and a fifth NMOS transistor 358 coupled to the node 'A'.

A gate terminal of each of the fifth PMOS transistor 356 and the fifth NMOS transistor 358 receives the output of the master transmission gate 304. A source terminal of the fifth PMOS transistor 356 is coupled to a power terminal VDD, and a source terminal of the fifth NMOS transistor 358 is coupled to a ground terminal. The first tri-state inverter 306 further includes a sixth PMOS transistor 360 and a sixth NMOS transistor 362.

A gate terminal of the sixth PMOS transistor 360 receives the inverted enable signal ENZ 318, and a gate terminal of the sixth NMOS transistor 362 receives the enable signal EN 316. A drain terminal of the fifth PMOS transistor 356 is coupled to a source terminal of the sixth PMOS transistor 360. A drain terminal of the fifth NMOS transistor 358 is coupled to a source terminal of the sixth NMOS transistor 362.

A drain terminal of the sixth PMOS transistor 360 is coupled to a drain terminal of the sixth NMOS transistor 362 at a node 'B'. The node 'B' receives an output of the first tri-state inverter 306.

The second tri-state inverter 308 receives the output of the first tri-state inverter 306, the clock input CLK 312 and the inverted clock input CLKZ 314. The first tri-state inverter 306 receives an output of the second tri-state inverter 308. The second tri-state inverter 308 includes a seventh PMOS transistor 364 and a seventh NMOS transistor 366. A gate terminal of the seventh PMOS transistor 364 and the seventh NMOS transistor 366 receives the output of the first tri-state inverter 306.

A source terminal of the seventh PMOS transistor 364 is coupled to the power terminal VDD, and a source terminal of the seventh NMOS transistor 366 is coupled to a ground terminal. The first tri-state inverter 306 further includes an eighth PMOS transistor 368 and a eighth NMOS transistor 370.

A gate terminal of the eighth PMOS transistor 368 receives the inverted clock input CLKZ 314, and a gate terminal of the eighth NMOS transistor 370 receives the clock input CLK 312. A drain terminal of the seventh PMOS transistor 364 is coupled to a source terminal of the eighth PMOS transistor 368. A drain terminal of the seventh NMOS transistor 366 is coupled to a source terminal of the eighth NMOS transistor 370.

A drain terminal of the eighth PMOS transistor 368 is coupled to a drain terminal of the eighth NMOS transistor 370 at the node 'A'. The node 'A' receives an output of the second tri-state inverter 308.

The slave latch 330 is coupled to the master latch 310. The slave latch 330 receives the enable signal EN 316 and the inverted enable signal ENZ 318. The slave latch 330 also receives the clock input CLK 312 and the inverted clock input CLKZ 314. The slave latch 330 includes a slave transmission gate 322, a slave inverter 324 and a logic unit 325.

The slave transmission gate 322 receives the output of the first tri-state inverter 306, the clock input CLK 312 and the inverted clock input CLKZ 314. The slave transmission gate 322 is coupled to the node 'B'. The slave transmission gate 322 includes a ninth PMOS transistor 372 and a ninth NMOS transistor 374.

A gate terminal of the ninth PMOS transistor 372 receives the inverted clock input CLKZ 314. A gate terminal of the ninth NMOS transistor 374 receives the clock input CLK 312. A source terminal of each of the ninth PMOS transistor 372 and the ninth NMOS transistor 374 receives the output of the first tri-state inverter 306. A drain terminal of each of the ninth PMOS transistor 372 and the ninth NMOS transistor 374 are coupled to a first node 'N'.

The slave inverter 324 receives an output of the slave transmission gate 322. The slave inverter 324 includes a tenth PMOS transistor 376 and a tenth NMOS transistor 378. A gate terminal of the tenth PMOS transistor 376 and the tenth NMOS transistor 378 receives the output of the slave transmission gate 322. A source terminal of the tenth PMOS transistor 376 is coupled to the power terminal VDD, and a source terminal of the tenth NMOS transistor 378 is coupled to the ground terminal. The output of the slave inverter 324 is received at a node 'C'.

The logic unit 325 receives an output of the slave inverter 324. The slave inverter 324 receives an output of the logic unit 325. The logic unit 325 includes a first PMOS transistor 380 and a first NMOS transistor 382. A gate terminal of each of the first PMOS transistor 380 and the first NMOS transistor 382 receives the output of the slave inverter 324.

A source terminal of the first PMOS transistor 380 is coupled to the power terminal VDD, and a source terminal of the first NMOS transistor 382 is coupled to the ground terminal. A second PMOS transistor 384 is coupled to a drain terminal of the first PMOS transistor 380. A gate terminal of the second PMOS transistor 384 receives the clock input CLK 312.

A second NMOS transistor 386 is coupled to a drain terminal of the first NMOS transistor 382 and receives the inverted clock input CLKZ 314. A drain terminal of the second PMOS transistor 384 is coupled to a drain terminal of the second NMOS transistor 386 at the first node 'N'.

A source terminal of a third PMOS transistor 388 is coupled to the drain terminal of the first PMOS transistor 380. A gate terminal of the third PMOS transistor 388 receives the enable signal EN 316.

A source terminal of a third NMOS transistor 390 is coupled to the drain terminal of the first NMOS transistor 382. A gate terminal of the third NMOS transistor 390 receives the inverted enable signal ENZ 318. A drain terminal of the third PMOS transistor 388 is coupled to a drain terminal of the third NMOS transistor 390 at the first node N.

The output inverter 334 is coupled to the first node 'N' and receives the output of the slave transmission gate 322. The output inverter 334 generates a flip-flop output Q 336. The output inverter 334 includes a PMOS transistor 346 and an NMOS transistor 348. A gate terminal of the PMOS transistor 346 and the NMOS transistor 348 receives the output of the slave transmission gate 322.

A source terminal of the PMOS transistor 346 is coupled to the power terminal VDD, and a source terminal of the NMOS transistor 348 is coupled to the ground terminal. A drain terminal of the PMOS transistor 346 is coupled to a drain terminal of the NMOS transistor 348 to generate the flip-flop output Q 336.

The clock inverter 338 in the flip-flop 300 receives the clock input CLK 312, and generates the inverted clock input CLKZ 314 in response to the clock input CLK 312. The clock inverter 338 includes a eleventh PMOS transistor 396 and a eleventh NMOS transistor 398. A gate terminal of the eleventh PMOS transistor 396 and the eleventh NMOS transistor 398 receives the clock input CLK 312.

A source terminal of the eleventh PMOS transistor 396 is coupled to the power terminal VDD, and a source terminal of the eleventh NMOS transistor 398 is coupled to the ground terminal. A drain terminal of the eleventh PMOS transistor 396 is coupled to a drain terminal of the eleventh NMOS transistor 398 to generate the inverted clock input CLKZ 314.

The enable inverter 340 in the flip-flop 300 receives the inverted enable signal ENZ 318, and generates the enable signal EN 316 in response to the inverted enable signal ENZ 318. The enable inverter 340 includes a twelfth PMOS transistor 392 and a twelfth NMOS transistor 394. A gate terminal of the twelfth PMOS transistor 392 and the twelfth NMOS transistor 394 receives the inverted enable signal ENZ 318.

A source terminal of the twelfth PMOS transistor 392 is coupled to the power terminal VDD, and a source terminal of the twelfth NMOS transistor 394 is coupled to the ground terminal. A drain terminal of the twelfth PMOS transistor 392 is coupled to a drain terminal of the twelfth NMOS transistor 394 to generate the enable signal EN 316.

The master latch 310 and the slave latch 330 receives at least one of a clear signal and a preset signal. The clear signal clear the bit values stored in the master latch 310 and the slave latch 330. The preset signal restores the bit values stored in the master latch 310 and the slave latch 330 to predefined values.

The flip-flop 300 may include one or more additional components or inputs known to those skilled in the relevant art and are not discussed here for simplicity of the description. The operation of the flip-flop 300 is similar to the operation of the flip-flop 200 and is thus not explained here for brevity of the description.

Figure 4:
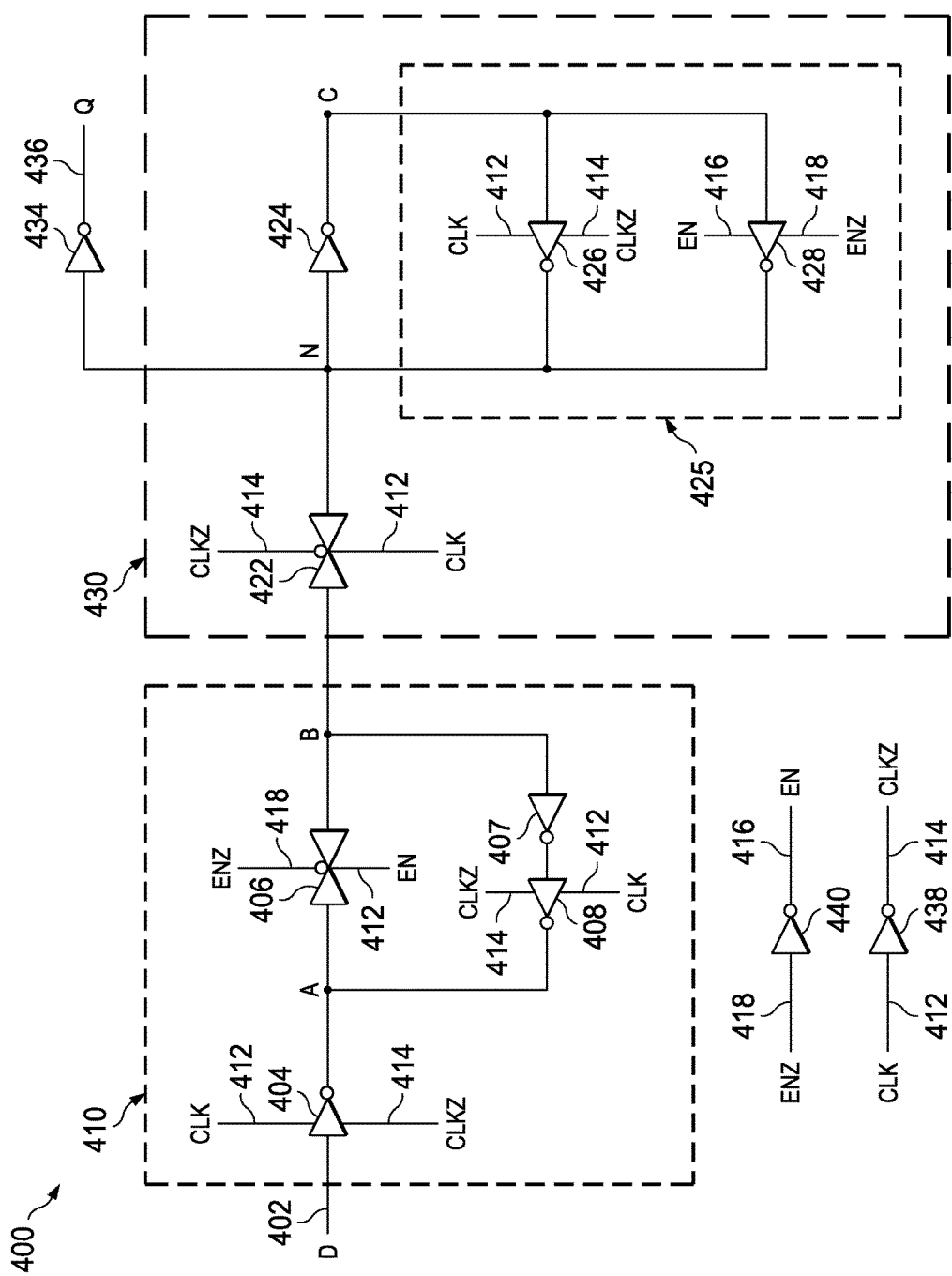
FIG. 4 illustrates a schematic of a flip-flop, according to an embodiment.

FIG. 4 illustrates a schematic of a flip-flop 400, according to an embodiment. The flip-flop 400 is one of a positive edge triggered flip-flop and a negative edge triggered flip-flop. The flip-flop 400 includes a master latch 410, a slave latch 430, an output inverter 434, a clock inverter 438 and an enable inverter 440. The master latch 410 receives a flip-flop input D 402, a clock input CLK 412, an inverted clock input CLKZ 414, an enable signal EN 416 and an inverted enable signal ENZ 418.

The master latch 410 includes a third tri-state inverter 404, a first transmission gate 406, a master inverter 407 and a fourth tri-state inverter 408. The third tri-state inverter 404 receives the flip-flop input D 402, the clock input CLK 412 and the inverted clock input CLKZ 414. The first transmission gate 406 is coupled to the third tri-state inverter 404 at a node 'A' and receives an output of the third tri-state inverter 404. The first transmission gate 406 further receives the enable signal EN 416 and the inverted enable signal ENZ 418.

The master inverter 407 receives an output of the first transmission gate 406. The fourth tri-state inverter 408 receives an output of the master inverter 407, the clock input CLK 412 and the inverted clock input CLKZ 414. A node 'B' also receives the output of the first transmission gate 406. The first transmission gate 406 receives an output of the fourth tri-state inverter 408. The slave latch 430 is coupled to the master latch 410. The slave latch 430 receives the enable signal EN 416 and the inverted enable signal ENZ 418. The slave latch 430 also receives the clock input CLK 412 and the inverted clock input CLKZ 414.

The slave latch 430 includes a slave transmission gate 422, a slave inverter 424 and a logic unit 425. The slave transmission gate 422 receives the output of the first transmission gate 406, the clock input CLK 412 and the inverted clock input CLKZ 414. The slave transmission gate 422 is coupled to the node "B". The slave inverter 424 receives an output of the slave transmission gate 422. The logic unit 425 receives an output of the slave inverter 424. The output of the slave inverter 424 is received at a node 'C'. The slave inverter 424 receives an output of the logic unit 425.

The logic unit 425 includes a fifth tri-state inverter 426 and a sixth tri-state inverter 428. The fifth tri-state inverter 426 receives the output of the slave inverter 424, the clock input CLK 412 and the inverted clock input CLKZ 414. The sixth tri-state inverter 428 receives the output of the slave inverter 424, the enable signal EN 416 and the inverted enable signal ENZ 418.

A combined output of the fifth tri-state inverter 426 and the sixth tri-state inverter 428 is the output of the logic unit 425. The output of the logic unit 425 is received at a first node 'N' and provided to the slave inverter 424. The output inverter 434 is coupled to the first node 'N' and receives the output of the slave transmission gate 422. The output inverter 434 generates a flip-flop output Q 436.

The clock inverter 438 in the flip-flop 400 receives the clock input CLK 412, and generates the inverted clock input CLKZ 414 in response to the clock input CLK 412. The enable inverter 440 in the flip-flop 400 receives the inverted enable signal ENZ 418, and generates the enable signal EN 416 in response to the inverted enable signal ENZ 418.

The master latch 410 and the slave latch 430 receives at least one of a clear signal and a preset signal. The clear signal clears the bit values stored in the master latch 410 and the slave latch 430. The preset signal restores the bit values stored in the master latch 410 and the slave latch 430 to predefined values. The flip-flop 400 may include one or more additional components or inputs known to those skilled in the relevant art and are not discussed here for simplicity of the description.

The operation of the flip-flop 400 illustrated in FIG. 4 is explained now. The initial value of the flip-flop output Q 436 is assumed to be at logic '1'. In a first state, the clock input CLK 412 is at logic '0', the flip-flop input D 402 is at logic '0' and the inverted enable signal ENZ 418 is at logic '0'. Since, the flip-flop output Q 426 is at logic '1', the first node N is at logic 0 and node C is at logic 1. The node 'A' is at logic '1' and node 'B' is at logic '1'.

In a second state, the clock input CLK 412 transitions to logic '1'. The flip-flop input D 402 and the inverted enable signal ENZ 418 are still at logic '0'. Due to the clock input CLK 412 transitioning to logic '1', the third tri-state inverter 404 is inactivated and the slave transmission gate 422 is activated. Since, in the first state, node 'B' was at logic '1', the first node 'N' transition to logic '1'. Thus, a logic at node 'C' and at the flip-flop output Q 434 transition to logic '0'.

In a third state, the clock input CLK 412 transitions to logic '0', the flip-flop input D 402 transitions to logic '1' and the inverted enable signal ENZ 418 remains at logic '0'. Thus, the third tri-state inverter 404 is activated and the slave transmission gate 422 is inactivated. Thus, the node 'A' transitions to logic '0'. The first transmission gate 406 passes the logic at node 'A' and hence, the node 'B' transition to logic '0'. Since, the slave transmission gate 422 is inactivated, the first node 'N' remains at logic '1'. The flip-flop output Q 436 and the node 'C' remains at logic '0'.

In a fourth state, the clock input CLK 412 transitions to logic '1', the flip-flop input D 402 remains at logic '1' and the inverted enable signal ENZ 418 remains at logic '0'. The third tri-state inverter 404 is inactivated and the slave transmission gate 422 is activated. Thus, the node 'A' and the node 'B' remains at logic '0'. Since, the slave transmission gate 422 is activated, the first node 'N' transition to logic '0' because in the third state, logic '0' was stored at node 'B'. Henceforth, the flip-flop output Q 436 and the node 'C' transition to logic '1'.

When the inverted enable signal ENZ 418 transitions from logic '0' to logic '1', the first transmission gate 406 is inactivated. Thus, the node 'B' is tri-stated. The flip-flop output Q 436 remains at logic '1'. Also, the node 'N' and the node 'C' remain at logic '0' and '1' respectively. The third tri-state inverter 404 is activated when the clock input CLK 412 transitions to logic '0'. When the third tri-state inverter 404 is activated, the node 'A' is at the inverse logic as the flip-flop input D 402. When the clock input CLK 412 transition to logic '1', the third tri-state inverter 404 is inactivated. In this state, the node 'A' is tri-stated.

As long as the inverted enable signal ENZ 418 remains at logic '1' the flip-flop output Q 436 remains at logic '1'. This is because the node 'N' and the node 'C' are maintained in their previous state when the inverted enable signal ENZ 418 transition from logic '0' to logic '1'. The table 2 summarizes the states of the flip-flop 400.

TABLE 2

| ENZ | D | CLK | Node 'A' | Node 'B' | Node 'N' | Node 'C' | Q |
|---|---|---|---|---|---|---|---|
| 0 | 0 | 0 | 1 | 1 | 0 | 1 | 1 |
| 0 | 0 | 1 | 1 | 1 | 1 | 0 | 0 |
| 0 | 1 | 0 | 0 | 0 | 1 | 0 | 0 |
| 0 | 1 | 1 | 0 | 0 | 0 | 1 | 1 |
| 1 | 0 | 0 | 1 | Tri-stated | 0 | 1 | 1 |
| 1 | 0 | 1 | Tri-stated | Tri-stated | 0 | 1 | 1 |
| 1 | 1 | 0 | 0 | Tri-stated | 0 | 1 | 1 |
| 1 | 1 | 1 | Tri-stated | Tri-stated | 0 | 1 | 1 |

A transistor level implementation of the flip-flop 400 requires 28 transistors. Thus, a reduction in a number of transistors in the flip-flop 400 will reduce the area and therefore power consumed inside flip-flop 400. A reduction in area of flip-flop 400 directly improves the digital design area and the overall power consumption. The flip-flop 400 provides for lower dynamic power and lower leakage as compared to flip-flop 100.

Figure 5:
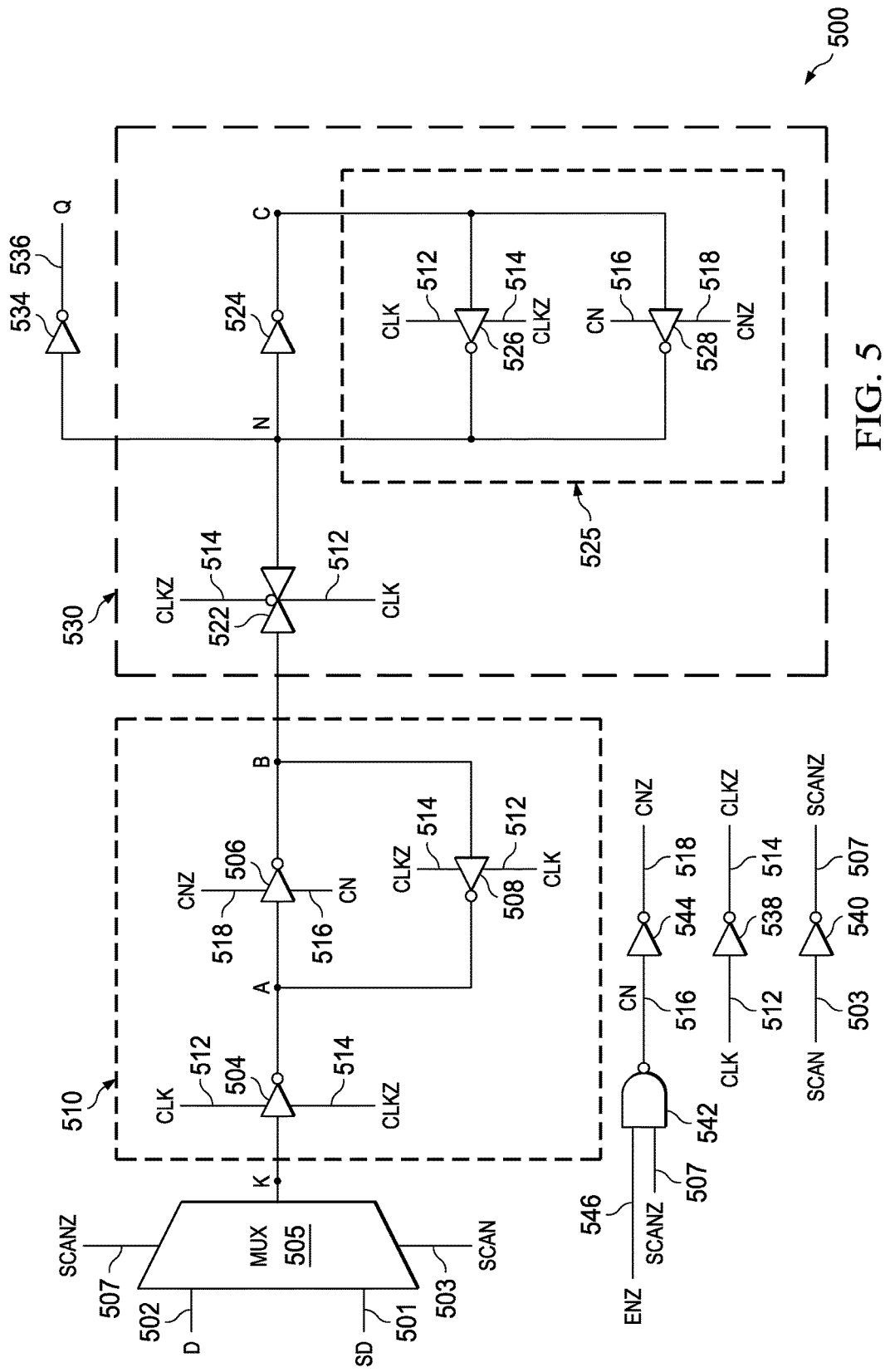
FIG. 5 illustrates a schematic of a scan flip-flop, according to an embodiment.

FIG. 5 illustrates a schematic of a scan flip-flop 500, according to an embodiment. The scan flip-flop 500 includes a multiplexer 505, a master latch 510, a slave latch 530, an output inverter 534, a clock inverter 538 and a scan inverter 540. The multiplexer 505 receives a flip-flop input D 502 and a scan input SD 501. The multiplexer 505 also receives a scan signal SCAN 503 and an inverted scan signal SCANZ 507 as selection signals. The multiplexer 505 is an inverting multiplexer.

The master latch 510 receives an output of the multiplexer 505, a clock input CLK 512, an inverted clock input CLKZ 514, a control signal CN 516 and an inverted control signal CNZ 518. The master latch 510 includes a master tri-state inverter 504, a first tri-state inverter 506 and a second tri-state inverter 508.

The master tri-state inverter 504 receives the output of the multiplexer 505, the clock input CLK 512 and the inverted clock input CLKZ 514. The first tri-state inverter 506 is coupled to the master tri-state inverter 504 at a node 'A' and receives an output of the master tri-state inverter 504. The first tri-state inverter 506 further receives the control signal CN 516 and the inverted control signal CNZ 518.

The second tri-state inverter 508 receives an output of the first tri-state inverter 506, the clock input CLK 512 and the inverted clock input CLKZ 514. A node 'B' also receives the output of the first tri-state inverter 506. The first tri-state inverter 506 receives an output of the second tri-state inverter 508. The slave latch 530 is coupled to the master latch 510. The slave latch 530 receives the control signal CN 516 and the inverted control signal CNZ 518. The slave latch 530 also receives the clock input CLK 512 and the inverted clock input CLKZ 514.

The slave latch 530 includes a slave transmission gate 522, a slave inverter 554 and a logic unit 525. The slave transmission gate 522 receives the output of the first tri-state inverter 506, the clock input CLK 512 and the inverted clock input CLKZ 514. The slave transmission gate 522 is coupled to the node 'B'. The slave inverter 524 receives an output of the slave transmission gate 522. The logic unit 525 receives an output of the slave inverter 524. The output of the slave inverter 554 is received at a node 'C'. The slave inverter 524 receives an output of the logic unit 525.

The logic unit 525 includes a fifth tri-state inverter 526 and a sixth tri-state inverter 528. The fifth tri-state inverter 526 receives the output of the slave inverter 524, the clock input CLK 512 and the inverted clock input CLKZ 514. The sixth tri-state inverter 528 receives the output of the slave inverter 524, the control signal CN 516 and the inverted control signal CNZ 518. In one version, the logic unit 525 is implemented using transistors similar to the logic unit 325 illustrated in FIG. 3.

A combined output of the fifth tri-state inverter 526 and the sixth tri-state inverter 528 is the output of the logic unit 525. The output of the logic unit 525 is received at a first node 'N' and provided to the slave inverter 524. The output inverter 534 is coupled to the first node 'N' and receives the output of the slave transmission gate 522. The output inverter 534 generates a flip-flop output Q 536.

The clock inverter 538 in the scan flip-flop 500 receives the clock input CLK 512, and generates the inverted clock input CLKZ 514 in response to the clock input CLK 512. The scan inverter 540 in the scan flip-flop 500 receives the scan signal SCAN 503, and generates the inverted scan signal SCANZ 507 in response to the scan signal SCAN 503.

The scan flip-flop 500 further includes a NAND gate 542. The NAND gate 542 receives the inverted scan signal SCANZ 507 and an inverted enable signal ENZ 546. The NAND gate 542 generates the control signal CN 516. An inverter 544 is coupled to the NAND gate 542. The inverter 544 generates the inverted control signal CNZ 518 in response to the control signal CN 516 received from the NAND gate 542.

The master latch 510 and the slave latch 530 receives at least one of a clear signal and a preset signal. The clear signal clear the bit values stored in the master latch 510 and the slave latch 530. The preset signal restores the bit values stored in the master latch 510 and the slave latch 530 to predefined values. The scan flip-flop 500 may include one or more additional components or inputs known to those skilled in the relevant art and are not discussed here for simplicity of the description.

The operation of the scan flip-flop 500 illustrated in FIG. 5 is explained now. For the first four states explained, it is assumed that the scan signal SCAN 503 is at logic '0'.

The initial value of the flip-flop output Q 236 is assumed to be Q, and the initial value of the flip-flop input D 502 is assumed to be D. In a first state, the clock input CLK 512 is at logic '0', the inverted enable signal ENZ 546 is at logic '0' and the inverted control signal CNZ 518 is at logic '0'. The multiplexer 505 generates DZ since the multiplexer 505 is an inverting multiplexer, where DZ represents an inverse of the flip-flop input D 502. For example, when D is at logic '0', DZ is at logic '1' and vice-versa.

A node 'K' receives the output of the multiplexer 505. Thus, the node 'K' is having logic DZ. Since, the clock input CLK 512 is at logic '0', the master tri-state inverter 504 is activated. The master tri-state inverter 504 receives logic DZ from node 'K' and provides an inverted output. Thus, logic D is stored at the node 'A'.

Also, the first tri-state inverter 506 is activated as the inverted control signal CNZ 518 is at logic '0'. The first tri-state inverter 506 inverts the logic D at node 'A'. Thus, the node 'B' is at logic DZ. Since, the flip-flop output Q 526 is at logic Q, the first node 'N' is at logic QZ, where QZ represents an inverse of the flip-flop output Q 536. For example, when Q is at logic '0', QZ is at logic '1' and vice-versa. The node 'C' is at logic Q.

In a second state, the clock input CLK 512 transitions to logic '1'. The inverted enable signal ENZ 546 and the inverted control signal CNZ 518 are still at logic '0'. Due to the clock input CLK 512 transitioning to logic '1', the master tri-state inverter 504 is inactivated and the slave transmission gate 522 is activated. Since, in the first state, node 'B' was at logic DZ, the first node 'N' transition to logic DZ. Thus, a logic at node 'C' and at the flip-flop output Q 234 transition to logic D. The nodes 'K', 'A' and 'B' remain in their previous state (first state).

In a third state, the clock input CLK 512 transitions to logic '0'. The inverted enable signal ENZ 546 and the inverted control signal CNZ 518 transition to logic '1'. Thus, the master tri-state inverter 504 is activated and the slave transmission gate 522 is inactivated. The logic at the node 'K' remains DZ. Thus, the node 'A' is at logic D. The first tri-state inverter 506 is inactivated and hence, the node 'B' is tri-stated. The flip-flop output Q 536 remains at logic D. Since, the slave transmission gate 522 is inactivated, the first node 'N' remains at logic DZ and the node 'C' remains at logic D.

In a fourth state, the clock input CLK 512 transitions to logic '1'. The inverted enable signal ENZ 546 and the inverted control signal CNZ 518 remains at logic '1'. The master tri-state inverter 504 is inactivated. Thus, the node 'A' and the node 'B' are tri-stated. The logic at the node 'K' remains DZ. The flip-flop output Q 536 retains the previous state D. Since, the slave transmission gate 522 is inactivated, the first node 'N' remains at logic DZ and the node 'C' remains at logic D.

For the next four states explained, it is assumed that the scan signal SCAN 503 is at logic '1'. It is to be noted that the transmission of the scan input SD 501 depends only on the scan signal SCAN 503, irrespective of the inverted enable signal ENZ 546.

In a fifth state, the clock input CLK 512, the inverted enable signal ENZ 546 and the inverted control signal CNZ 518 transitions to logic '0'. The multiplexer 505 generates SDZ, where SDZ represents an inverse of the scan input SD 501. For example, when SD is at logic '0', SDZ is at logic '1' and vice-versa.

A node 'K' receives the output of the multiplexer 505. Thus, the node 'K' is having logic SDZ. Since, the clock input CLK 512 is at logic '0', the master tri-state inverter 504 is activated. The master tri-state inverter 504 receives logic SDZ from node 'K' and provides an inverted output. Thus, logic SD is stored at the node 'A'.

Also, the first tri-state inverter 506 is activated as the inverted control signal CNZ 518 is at logic '0'. The first tri-state inverter 506 inverts the logic SD at node 'A'. Thus, the node 'B' is at logic SDZ. Since, the flip-flop output Q 526 is at logic D, the first node 'N' is at logic DZ. For example, when D is at logic '0', DZ is at logic '1' and vice-versa. The node 'C' is at logic D.

In a sixth state, the clock input CLK 512 transitions to logic '1'. The inverted enable signal ENZ 546 and the inverted control signal CNZ 518 are still at logic '0'. Due to the clock input CLK 512 transitioning to logic '1', the master tri-state inverter 504 is inactivated and the slave transmission gate 522 is activated. Since, in the first state, node 'B' was at logic SDZ, the first node 'N' transition to logic SDZ. Thus, a logic at node 'C' and at the flip-flop output Q 234 transition to logic SD. The nodes 'K', 'A' and 'B' remain in their previous state (first state).

In a seventh state, the clock input CLK 512 transitions to logic '0'. The inverted enable signal ENZ 546 transition to logic '1' and the inverted control signal CNZ 518 remain at logic '0'. Thus, the master tri-state inverter 504 is activated and the slave transmission gate 522 is inactivated. The logic at the node 'K' remains SDZ. Thus, the node 'A' is at logic SD. The first tri-state inverter 506 is activated and hence, the node 'B' is at logic SDZ. The flip-flop output Q 536 remains at logic SD as the sixth state. Since, the slave transmission gate 522 is inactivated, the first node 'N' remains at logic SDZ and the node 'C' remains at logic SD.

In an eighth state, the clock input CLK 512 transitions to logic '1'. The inverted enable signal ENZ 546 and the inverted control signal CNZ 518 remains at logic '1' and '0' respectively. The master tri-state inverter 504 is in activated and the slave transmission gate 522 is activated. Thus, the node 'A' and the node 'B' are at logic SD and SDZ respectively. The logic at the node 'K' remains SDZ. Since, the slave transmission gate 522 is activated, the first node 'N' transition to logic SDZ. The node 'C' and the flip-flop output Q 536 transition to the logic state SD.

The table 3 summarizes the states of the scan flip-flop 500.

TABLE 3

| SCAN | ENZ | CLK | CNZ | Node 'K' | Node 'A' | Node 'B' | Node 'N' | Node 'C' | Q |
|---|---|---|---|---|---|---|---|---|---|
| 0 | 0 | 0 | 0 | DZ | D | DZ | QZ | Q | Q |
| 0 | 0 | 1 | 0 | DZ | D | DZ | DZ | D | D |
| 0 | 1 | 0 | 1 | DZ | D | Tri-stated | DZ | D | D |
| 0 | 1 | 1 | 1 | DZ | Tri-stated | Tri-stated | DZ | D | D |
| 1 | 0 | 0 | 0 | SDZ | SD | SDZ | DZ | D | D |
| 1 | 0 | 1 | 0 | SDZ | SD | SDZ | SDZ | SD | SD |
| 1 | 1 | 0 | 0 | SDZ | SD | SDZ | SDZ | SD | SD |
| 1 | 1 | 1 | 0 | SDZ | SD | SDZ | SDZ | SD | SD |

The scan flip-flop 500 requires less number of transistors as compared to existing scan flip-flops. Thus, a reduction in a number of transistors in the scan flip-flop 500 will reduce the area and therefore power consumed inside scan flip-flop 500. A reduction in area of scan flip-flop 500 directly improves the digital design area and the overall power consumption.

In addition, the scan input SD 501 is required to traverse lesser number of stages before it reaches flip-flop output Q 536. This provides for lower dynamic power. With the lesser number of stages, there is less delay when an input is provided to the scan flip-flop 500 and an output is generated as the flip-flop output Q 536. The scan flip-flop 500 does not require any feedback of flip-flop output Q 536 as an input to the scan flip-flop 500 which is required by the existing solutions. The scan flip-flop 500 maintains the flip-flop output 536 at the previous state when the inverted enable signal ENZ 546 is at logic '1', thereby reducing switching power.

Figure 6:
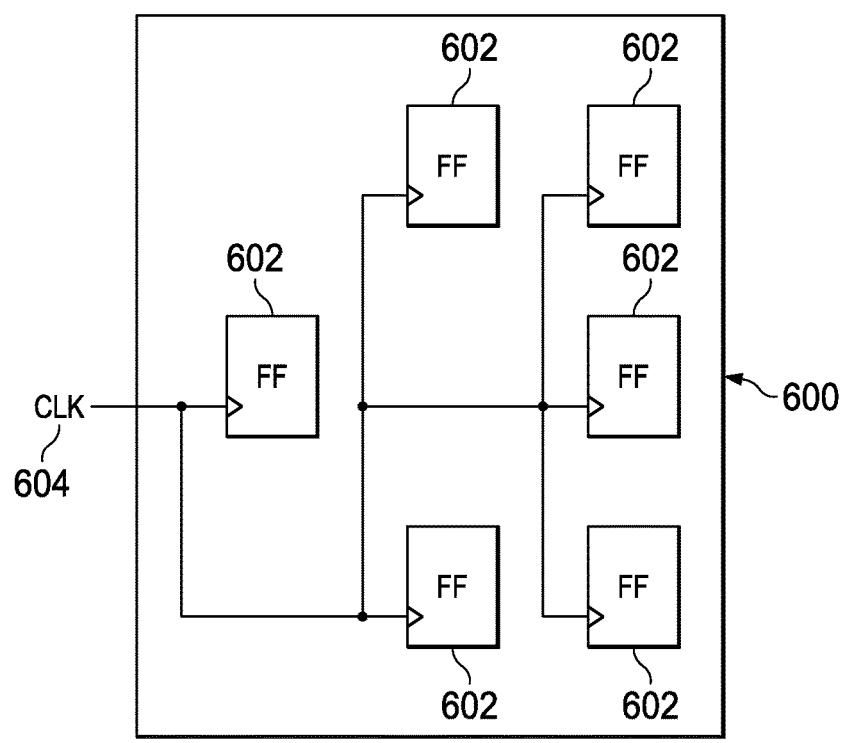
FIG. 6 illustrates schematic of an apparatus, according to the embodiment.

FIG. 6 illustrates schematic of an apparatus 600, according to the embodiment.

The apparatus 600 includes a clock input 604 and a plurality of flip-flops. Each flip-flop 602 of the plurality of flip-flops is configured to receive the clock input 604. Each flip-flop 602 of the plurality of flip-flops is analogous to at least one of the flip-flop 200, flip-flop 300, flip-flop 400 and scan flip-flop 500, in both connections and operations and thereby not repeated for the sake of simplicity.

The apparatus 600 includes the large numbers of flip-flops 602, hence with reduced transistor count, the power consumed by the apparatus 600 can be reduced. In the flip-flop 602 the transistor count is being reduced which results in reduced power consumption as compared to flip-flop 100. This reduces power consumption in the apparatus 600. Also, the flip-flop 602 requires less area as compared to flip-flop 100 thereby reducing the area required by the apparatus 600 considerably.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A flip-flop comprising:
   multiplexer circuitry having a data input and a scan data input, the multiplexer circuitry having a scan input and an inverted scan input as selection signals, the multiplexer circuitry having a multiplexer output;
   control circuitry having an input coupled to the inverted scan input, an inverted enable input, a control output, and an inverted control output;
   a master latch having an input coupled to the multiplexer output, a clock input, an inverted clock input, a control input coupled to the control output, an inverted control input couple to the inverted control output, and a master latch output;
   a slave latch having a slave latch input coupled to the master latch output, an input coupled to the control output, an input coupled to the inverted control output, and having a slave latch output; and
   an output inverter having a data input coupled to the slave latch output having a flip-flop output.

2. The flip-flop of claim 1 including a clock inverter having an input coupled to the clock input and having an inverted clock output coupled to the inverted clock input.

3. The flip-flop of claim 1 further including a scan inverter having an input coupled to the scan input and having an inverted scan output coupled to the inverted scan input.

4. The flip-flop of claim 1, in which the master latch includes:
   a master tri-state inverter having an input coupled to the slave latch input, an input coupled to the clock input, an input coupled to the inverted clock input, and having an output;
   a first tri-state inverter having a first tri-state input coupled to the output of the master tri-state inverter, an input coupled to the control output, an input coupled to the inverted control output, and having an output; and
   a second tri-state inverter having a second tristate input coupled to the output of the first tri-state inverter, an input coupled to the clock input, an input coupled to the inverted clock input, and having an output coupled to the first tri-state input.

5. The flip-flop of claim 4, in which the slave latch includes:
   a slave transmission gate having an input coupled to the output of the first tri-state inverter, an input coupled to the clock input, an input coupled to the inverted clock input, and an output;
   a slave inverter having a slave inverter input coupled to the output of the slave transmission gate, and having an output; and
   a logic unit having an input coupled to the output of the slave inverter, and an output coupled to the slave inverter input.

6. The flip-flop of claim 5, in which the logic unit includes:
   a third tri-state inverter having an input coupled to the output of the slave inverter, an input coupled to the the clock input, an input coupled to the inverted clock input, and having an output coupled to the slave inverter input; and a fourth tri-state inverter having an input coupled to the output of the slave inverter, an input coupled to the control input, an input coupled to the inverted control input, and having an output coupled to the slave inverter input.

7. The flip-flop of claim 6, in which the data input of the output inverter is coupled to the output of the slave transmission gate.

* * * * *